(12) United States Patent
Ueno et al.

(10) Patent No.: US 8,937,274 B2
(45) Date of Patent: Jan. 20, 2015

(54) SOLID-STATE IMAGING DEVICE AND PORTABLE INFORMATION TERMINAL HAVING A PROPORTION OF W PIXELS INCREASES TOWARD AN OUTER PERIPHERY OF EACH PIXEL BLOCK

(71) Applicants: Risako Ueno, Tokyo (JP); Hiroto Honda, Yokohama (JP); Mitsuyoshi Kobayashi, Yokohama (JP); Kazuhiro Suzuki, Tokyo (JP); Honam Kwon, Kawasaki (JP); Hideyuki Funaki, Tokyo (JP)

(72) Inventors: Risako Ueno, Tokyo (JP); Hiroto Honda, Yokohama (JP); Mitsuyoshi Kobayashi, Yokohama (JP); Kazuhiro Suzuki, Tokyo (JP); Honam Kwon, Kawasaki (JP); Hideyuki Funaki, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 217 days.

(21) Appl. No.: 13/713,304

(22) Filed: Dec. 13, 2012

(65) Prior Publication Data
US 2013/0240709 A1 Sep. 19, 2013

(30) Foreign Application Priority Data
Mar. 15, 2012 (JP) .................................. 2012-058857

(51) Int. Cl.
*H01L 27/00* (2006.01)
*H01L 27/146* (2006.01)

(52) U.S. Cl.
CPC ........ *H01L 27/146* (2013.01); *H01L 27/14605* (2013.01); *H01L 27/14627* (2013.01); *H01L 27/14645* (2013.01); *H01L 27/14625* (2013.01)
USPC ........................................ 250/208.1; 250/216

(58) Field of Classification Search
USPC ............... 250/208.1, 216, 239; 359/494, 495, 359/566; 348/335, 340, 345, 348, 350; 257/440
See application file for complete search history.

(56) References Cited

U.S. PATENT DOCUMENTS

| 6,540,361 | B1 * | 4/2003 | Hayashi .......................... 353/31 |
| 2012/0050589 | A1 | 3/2012 | Ueno et al. |
| 2012/0057020 | A1 | 3/2012 | Kobayashi et al. |
| 2012/0062771 | A1 | 3/2012 | Ueno et al. |
| 2012/0218448 | A1 | 8/2012 | Ueno et al. |
| 2012/0218454 | A1 | 8/2012 | Suzuki et al. |
| 2012/0229683 | A1 | 9/2012 | Kobayashi et al. |

OTHER PUBLICATIONS

U.S. Appl. No. 13/416,036, filed Mar. 9, 2012, Kazuhiro Suzuki, et al.
U.S. Appl. No. 13/416,290, filed Mar. 9, 2012, Kazuhiro Suzuki, et al.

(Continued)

*Primary Examiner* — Que T Le
(74) *Attorney, Agent, or Firm* — Oblon, Spivak, McClelland, Maier & Neustadt, L.L.P.

(57) ABSTRACT

A solid-state imaging device according to an embodiment includes: an imaging element including a semiconductor substrate and a plurality of pixel blocks, each of the pixel blocks including at least two of R pixels, G pixels, B pixels, and W pixels; a first optical system configured to form an image of an object on an imaging plane; and a second optical system including a microlens array having a plurality of microlenses provided for the respective pixels blocks, the second optical system being located between the imaging element and the first optical system, the second optical system being configured to reduce and re-image the image formed on the imaging plane onto each of the pixel blocks. A proportion of the W pixels to be provided increases in a direction from a center of each pixel block toward an outer periphery thereof.

12 Claims, 12 Drawing Sheets

(56) References Cited

OTHER PUBLICATIONS

U.S. Appl. No. 13/361,293, filed Jan. 30, 2012, Mitsuyoshi Kobayashi, et al.
U.S. Appl. No. 13/361,321, filed Jan. 30, 2012, Risako Ueno, et al.
Keith Fife, et al., "A 3D Multi-Aperture Image Sensor Architecture", IEEE 2006 Custom Intergrated Circuits Conference (CICC), Sep. 2006, pp. 281-284.
U.S. Appl. No. 14/202,402, filed Mar. 10, 2014, Suzuki, et al.
U.S. Appl. No. 14/077,537, filed Nov. 12, 2013, Honda, et al.
U.S. Appl. No. 14/165,925, filed Jan. 28, 2014, Kobayashi, et al.

* cited by examiner

SOLID-STATE IMAGING DEVICE AND PORTABLE INFORMATION TERMINAL HAVING A PROPORTION OF W PIXELS INCREASES TOWARD AN OUTER PERIPHERY OF EACH PIXEL BLOCK

CROSS-REFERENCE TO RELATED APPLICATION

This application is based upon and claims the benefit of priority from prior Japanese Patent Application No. 2012-58857 filed on Mar. 15, 2012 in Japan, the entire contents of which are incorporated herein by reference.

FIELD

Embodiments described herein relate generally to solid-state imaging devices and portable information terminals that can simultaneously obtain a two-dimensional visible image and information about the distance to an object in the depth direction.

BACKGROUND

Various techniques such as a technique using reference light and a stereo ranging technique using two or more cameras have been suggested as imaging techniques for obtaining two-dimensional array information about the distances to objects in the depth direction. Particularly, in recent years, there has been an increasing demand for relatively inexpensive products as novel input devices for consumer use.

In view of this, a compound-eye imaging device that has an imaging lens that can obtain a large number of parallax images and restrains decreases in resolution has been suggested. In this imaging device, an imaging lens is provided, and optical systems are provided as a re-imaging optical system between the imaging lens and an imaging element. As the optical systems, a microlens array having a large number of microlenses formed on a flat surface is used, for example. Pixels are provided below the microlens array at locations corresponding to the respective microlenses, and those pixels obtain images of the corresponding lenses. An image formed by the imaging lens is re-imaged on the imaging element by the re-imaging microlenses, and the re-imaged individual lens images are images with viewpoint shifts due to the parallax existing at the locations of the respective microlenses.

By performing image processing on the parallax images obtained from the large number of microlenses, the distance to the object can be estimated based on the principle of triangulation. Also, by performing image processing for combining those parallax images, a two-dimensional image can be reconstructed.

However, when the above described compound-eye imaging device is formed, there are decreases in light amount at locations where an imaged height of the imaging lens is high, and there are decreases in light amount around microlens images. In the pixels in the low-illuminance region having decreases in light amount, S/N ratios of signals are degraded.

DETAILED DESCRIPTION

A solid-state imaging device according to an embodiment includes: an imaging element including a semiconductor substrate and a plurality of pixel blocks, each of the pixel blocks including at least two of R pixels, G pixels, B pixels, and W pixels; a first optical system configured to form an image of an object on an imaging plane; and a second optical system including a microlens array having a plurality of microlenses provided for the respective pixels blocks, the second optical system being located between the imaging element and the first optical system, the second optical system being configured to reduce and re-image the image formed on the imaging plane onto each of the pixel blocks. A proportion of the W pixels to be provided increases in a direction from a center of each pixel block toward an outer periphery thereof. The following is a description of embodiments, with reference to the accompanying drawings.

First Embodiment

Structure of Camera Module

Figure 1:
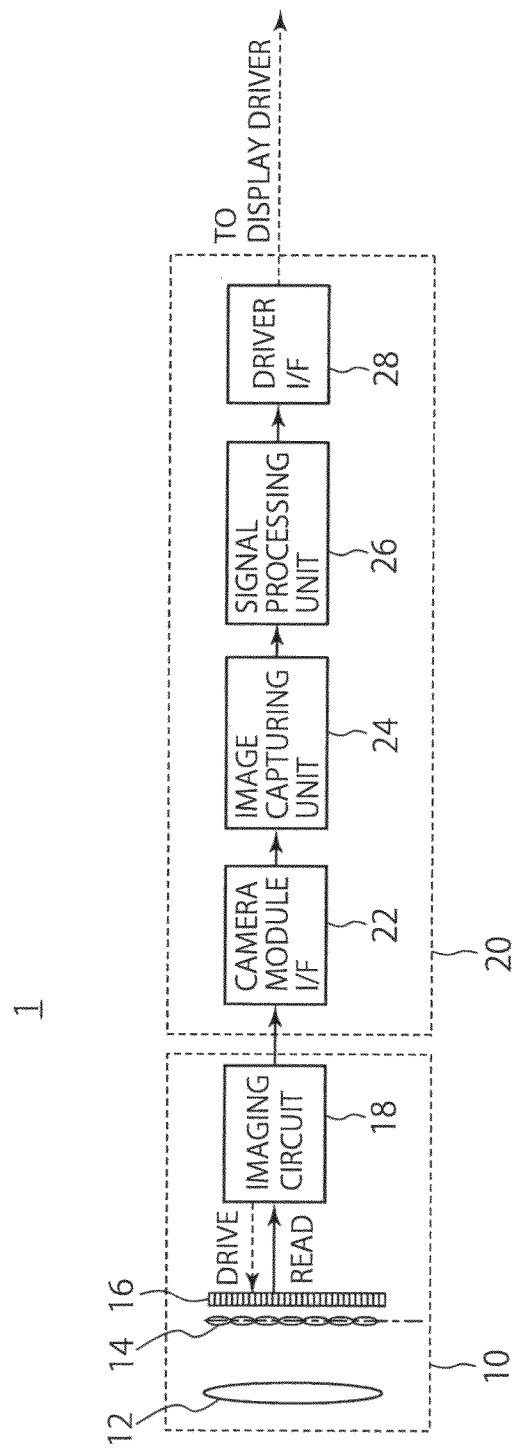
FIG. 1 is a block diagram of a solid-state imaging device according to a first embodiment.

FIG. 1 shows a solid-state imaging device (also referred to as a camera module) according to a first embodiment. The solid-state imaging device 1 of the first embodiment includes an imaging module unit 10 and an image signal processor 20 (hereinafter also referred to as the ISP) 20.

The imaging module unit 10 includes imaging optics (a first optical system) 12, a microlens array (a second optical system) 14, an imaging element 16, and an imaging circuit 18. The imaging optics 12 functions as an imaging optical system that captures light from an object into the imaging element 16. The imaging element 16 functions as an element that converts the light captured by the imaging optics 12 to signal charges, and has pixels (such as photodiodes serving as photoelectric conversion elements) arranged in a two-dimensional array. The microlens array 14 is a microlens array that includes microlenses, or is a microoptical system that includes prisms, for example. The microlens array 14 functions as an optical system that reduces and re-images a group of light beams gathered onto the imaging plane by the imaging optics 12, onto pixel blocks corresponding to the respective microlenses. The imaging circuit 18 includes a drive circuit unit (not shown) that drives the respective pixels of the pixel array of the imaging element 16, and a pixel signal processing circuit unit (not shown) that processes signals output from the pixel region. The drive circuit unit includes a vertical select circuit that sequentially selects pixels to be driven for each line (row) parallel to the vertical direction, a horizontal select circuit that sequentially selects pixels for each column, and a TG (timing generator) circuit that drives those select circuits with various pulses. The pixel signal processing circuit unit includes an A-D converter circuit that converts analog electrical signals supplied from the pixel region into digital signals, a gain adjustment/amplifier circuit that performs gain adjustments and amplifying operations, and a digital signal processing circuit that performs corrections and the like on digital signals.

The ISP 20 includes a camera module interface (I/F) 22, an image capturing unit 24, a signal processing unit 26, and a driver interface (I/F) 28. A RAW image obtained through an imaging operation performed by the imaging module unit 10 is captured by the camera module interface 22 into the image capturing unit 24. The signal processing unit 26 performs signal processing on the RAW image captured into the image capturing unit 24. The driver interface 28 outputs the image signal subjected to the signal processing performed by the signal processing unit 26, to a display driver (not shown). The display driver displays the image captured by the solid-state imaging device 1.

Figure 2:
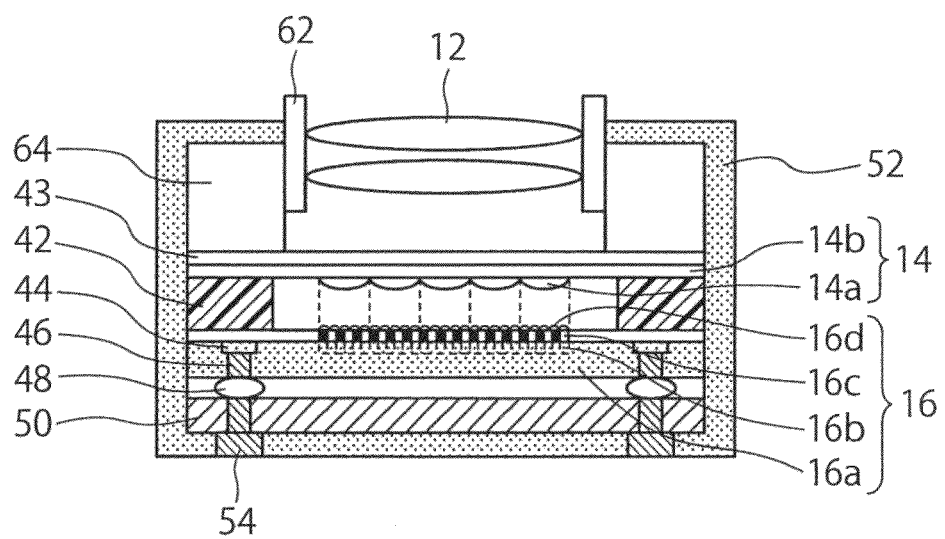
FIG. 2 is a cross-sectional view of an imaging module according to the first embodiment.

FIG. 2 illustrates a cross-section of the solid-state imaging device 1 according to the first embodiment. As shown in FIG. 2, in the solid-state imaging device 1 of the first embodiment, the imaging element 16 has a structure in which pixels 16b including photodiodes are formed on a semiconductor substrate 16a, and a drive/read circuit (not shown) that drives those pixels 16b and read signals from the pixels 16b is formed on the semiconductor substrate 16a. On the pixels 16b, color filters 16c of R (having high transmittance for light in the red light wavelength range), G (having high transmittance for light in the green light wavelength range), B (having high transmittance for light in the blue light wavelength range), and W (which passes light in the red, green, and blue wavelength ranges) are formed for the respective pixels 16b. The arrangement of the color filters 16c will be described later. On the color filters 16c, a microlens 16d for collecting pixel light can be formed for each one pixel. The pixels having the R color filters formed thereon are R pixels, the pixels having the G color filters formed thereon are G pixels, the pixels having the B color filters formed thereon are B pixels, and the pixels having the W color filters formed thereon are W pixels.

The microlens array 14 is placed above the color filters 16c. The microlens array 14 includes a microlens unit 14a that is formed on a visible light transmissive substrate 14b. The microlens unit 14a is located on the side of the visible light transmissive substrate 14b facing the imaging element 16, and includes microlenses arranged in a two-dimensional array. Each of the microlenses corresponds to a pixel block formed with pixels provided on the semiconductor substrate 16a, and functions as an optical system that reduces and forms an image on the corresponding pixel block. Each pixel block is formed with pixels, and one microlens overlaps with one pixel block in a direction (the z-direction) parallel to the optical axis of the imaging optics 12. Each one pixel block faces one microlens, and has the same size as the microlens or has a larger size than the microlens. Such an imaging region includes the pixel blocks, and each of the pixel blocks includes at least two pixels.

The visible light transmissive substrate 14b is bonded to the semiconductor substrate 16a with a positioning spacer 42 that is provided around the imaging region having the pixels 16b formed therein and is made of a resin material or the like. The positioning for bonding the semiconductor substrate 16a to the visible light transmissive substrate 14b is performed on the basis of positioning marks or the like. The visible light transmissive substrate 14b can be made of a material that has not only the function to pass visible light but also the function to cut off unnecessary near-infrared light, for example, or can be formed with a multilayer film or a single-layer film that passes visible light but reflects near-infrared light. An optical filter 43 is provided, where necessary, on the opposite side of the visible light transmissive substrate 14b from the imaging element 16. In a case where the visible light transmissive substrate 14b does not have the function to cut off near-infrared light, for example, the optical filter 43 having the function to cut off near-infrared light is provided.

Electrode pads 44 for reading the pixels 16b are provided on the semiconductor substrate 16a, and penetrating electrodes 46 that penetrate through the semiconductor substrate 16a and continue to a processing and driving chip 50 are formed below the electrode pads 44. The semiconductor substrate 16a is electrically connected to the processing and driving chip 50 via the penetrating electrodes 46 and bumps 48. A driving and processing circuit (the imaging circuit 18) that drives the imaging device and processes read signals is formed in the processing and driving chip 50. The electrical connection between the semiconductor substrate 16a and the processing and driving chip 50 can be established via the penetrating electrodes 46. Alternatively, the electrode pads 44 can also be provided on the processing and driving chip 50, and metal wires or the like may connect the electrode pads 44 on the processing and driving chip 50 to the electrode pads 44 on the semiconductor substrate 16a.

The imaging lens 12 that is the imaging optics and is formed with one or more lenses is provided above the visible light transmissive substrate 14a. This imaging lens 12 is attached to a lens barrel 62. The lens barrel 62 is attached to a lens holder 64. At the time of the attachment to the lens holder 64, the attachment position of the lens 12 can be adjusted based on the relationship between the pressing force and an output image. A light shielding cover 52 for shielding unnecessary light is provided around the semiconductor substrate 16a, the visible light transmissive substrate 14b, and the chip 50. Module electrodes 54 that electrically connect the chip 50 to the outside are provided under the processing and driving chip 50.

(Relationship in Geometric Optics Between Microlenses Near the Optical Axis of the Imaging Lens)

Referring now to FIGS. 3(a) and 3(b), the relationship in geometric optics in the optical system (a virtual image optical system) of the solid-state imaging device 1 of this embodiment is described. For ease of explanation, only the region near the optical axis of the imaging lens is described herein. FIG. 3(b) is an enlarged view of the region near the optical axes of the microlenses shown in FIG. 3(a). In FIG. 3(a), the imaging lens 12 is formed with one lens.

When there is only the imaging optics (the imaging lens) 12, chief rays 84a, 84b, and 84c from an object point P of an object 100 on the optical axis, and peripheral rays 86 that are homologous rays of the chief rays form an image on a virtual imaging plane (an imaging plane) 70 determined from the focal length f of the imaging optics 12 and the distance A between the imaging optics 12 and the object 100. The imaging is performed to satisfy the following equation (1):

$$\frac{1}{f} = \frac{1}{A} + \frac{1}{B} \quad (1)$$

Here, f represents the focal length of the imaging lens 12, A represents the distance from the principal surface 12a of the imaging lens 12 to the object point P, and B represents the distance from the principal surface 12a of the imaging lens 12 to a virtual imaging point P' on the virtual imaging plane 70. The image magnification (lateral magnification) M of the imaging lens 12 is expressed by the following equation (2). The principal surface 12a is a surface that passes through the center of the imaging lens 12 and is perpendicular to the optical axis.

$$M = \frac{B}{A} \quad (2)$$

In this embodiment, the virtual imaging point P' of the imaging lens 12 is located further behind the imaging element 16, or on the opposite side of the imaging element 16 from the object 100. Since the microlens unit 14a is located ahead of the virtual imaging point P' at this point, light is gathered onto the surface of the imaging element 16, which is located ahead of the virtual imaging plane 70 and has the pixels provided therein. Here, light rays 80 are reduced to form an image based on a virtual image relationship. The imaging system of the microlens unit 14a is expressed by the following equation (3):

$$\frac{1}{g} = -\frac{1}{C} + \frac{1}{D} \quad (3)$$

Here, g represents the focal length of the microlens unit 14a, C represents the distance from the principal surface of the microlens unit 14a to the virtual imaging point P' (the object distance), and D represents the distance from the principal surface of the microlens unit 14a to the imaging points of the microlenses. At this point, the image magnification N of the imaging system of the microlens unit 14a is expressed by the following equation (4):

$$N = \frac{D}{C} \quad (4)$$

Here, a variable E defined by the equation (5) is introduced based on the geometric relationship. In a case where the optical system is a fixed-focus optical system, the variable E is a fixed design value.

$$E = B - C \quad (5)$$

Where two adjacent microlenses of the microlens unit 14a are selected, the array pitch between the microlenses or the distance between the center points of the microlenses is represented by $L_{ML}$. The light rays 84a, 84b, 84c, and 86 from the same object 100 are divided into image points and form images at respective locations in the microlenses. The distance $L_{ML}$ and the image shift length Δ on one side of the microlens are expressed by the following equation (6), based on the geometric relationship among the principal light rays 84a, 84b, and 84c for the respective microlenses of the microlens unit 14a shown in FIG. 3(b):

$$\frac{C}{L_{ML}} = \frac{D}{\Delta} \quad (6)$$

According to the equations (1), (2), and (6), the distance A from the imaging optics 12 to the object 100 and the shift length Δ of the image of the object 100 have the relationship expressed by the following equation (7):

$$A = \left(\frac{1}{f} - \frac{1}{B}\right)^{-1} = \left(\frac{1}{f} - \frac{1}{E+C}\right)^{-1} = \left(\frac{1}{f} - \frac{1}{E + \frac{DL_{ML}}{\Delta}}\right)^{-1} \quad (7)$$

In the equation (7), the focal length f, the variable E, and the distance $L_{ML}$ are the parameters at the time of design and are known fixed values. Accordingly, the image shift length Δ and the distance D are uniquely determined by the object distance A.

Since the variation in the distance D is very small compared with the variation in the distance A, the distance D is regarded as a fixed value $D_0$. The fixed value $D_0$ indicates the distance from the image-side principal surface of the microlens unit 14a to the surface of the imaging element 16. At this point, the equation (7) is transformed into the following equation (8):

$$A = \left(\frac{1}{f} - \frac{1}{B}\right)^{-1} = \left(\frac{1}{f} - \frac{1}{E+C}\right)^{-1} = \left(\frac{1}{f} - \frac{1}{E + \frac{D_0 L_{ML}}{\Delta}}\right)^{-1} \quad (8)$$

Here, the focal length f, the variable E, the distance $D_0$, and the distance $L_{ML}$ are set values and therefore, are known values. Accordingly, if the image shift length Δ can be detected from the imaging element 16, the object distance A can be calculated.

To determine the shift length Δ between images when light rays generated from the same object point P form images at p1, p2, and p3 through the microlens unit 14a, an image matching operation between the microlens images recorded by the imaging element 16 is used.

In the image matching operation, a known template matching method to examine the similarities and differences between two images can be used, for example. To determine the shift length Δ with even higher precision, the similarities and differences obtained from the respective pixels are interpolated by a continuous fitting function or the like, and the sub pixel positions that give the maximum value and the minimum value of the fitting function are determined. In this manner, the shift length Δ can be determined with even higher precision.

(Method of Reconstructing a Two-Dimensional Image)

Figure 4:
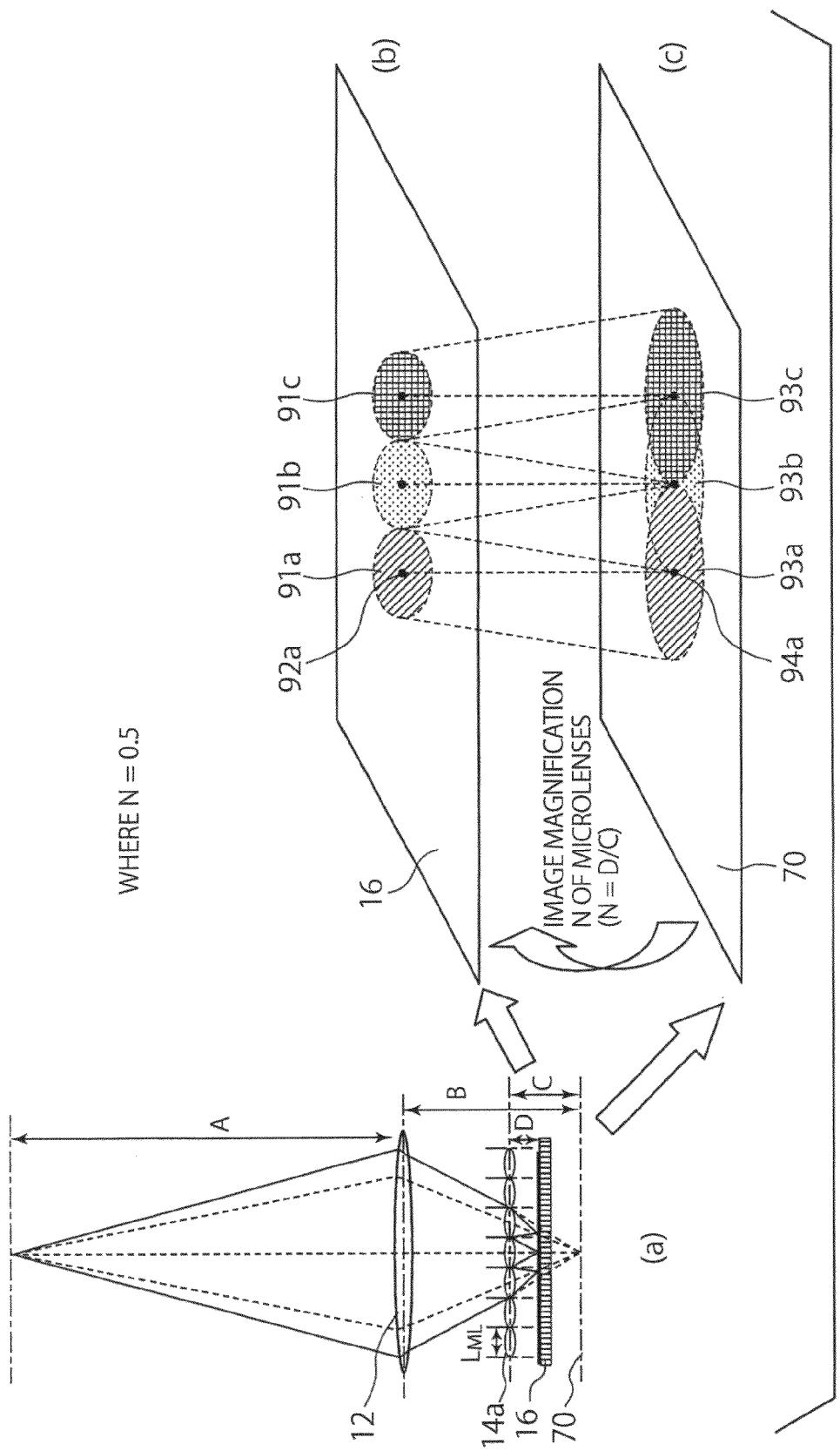
FIGS. 4(a) through 4(c) are diagrams for explaining a method of reconstructing a two-dimensional image.

Referring now to FIGS. 4(a) through 4(c), a method of reconstructing a two-dimensional image, without overlaps, from microlens images formed by capturing an image of the same object twice or more is described. This reconstruction is conducted at the signal processing unit 26 shown in FIG. 1, for example.

There are three adjacent microlenses, and those microlenses form microlens images 91a, 91b, and 91c, respectively, on the surface of the imaging element 16, as shown in FIG. 4(b) and FIG. 4(c). To form microlens images without overlaps in this manner, the effective F number of the imaging lens 12 and the effective F number of each microlens of the microlens unit 14a are set at the same values or values close to each other.

The visual fields in which the microlens images 91a, 91b, and 91c are formed are a visual field 93a, a visual field 93b, and a visual field 93c on the virtual imaging plane 70, and there are overlaps as shown in FIG. 4(c). In the example case illustrated in FIGS. 4(b) and 4(c), the microlens image magnification N is 0.5, and as a result of making each visual field 0.5 times larger, each object point is imaged with two or more overlaps. Where the magnification N is 0.5, each microlens image is made 1/N times larger or twice larger, to reproduce the image on the virtual imaging plane 70.

The image reduction rate (the image magnification) N is determined from captured microlens images, using the fact that the following equation (9) is obtained from the relationships expressed by the equations (4) and (6):

$$N = \frac{D}{C} = \frac{\Delta}{L_{ML}} \quad (9)$$

Since the microlens pitch $L_{ML}$ is a known value, the image reduction rate N is determined by calculating the shift length $\Delta$ of the same object from the images.

(Synthesis Method for Reconstructing a Two-Dimensional Image)

Figure 5:
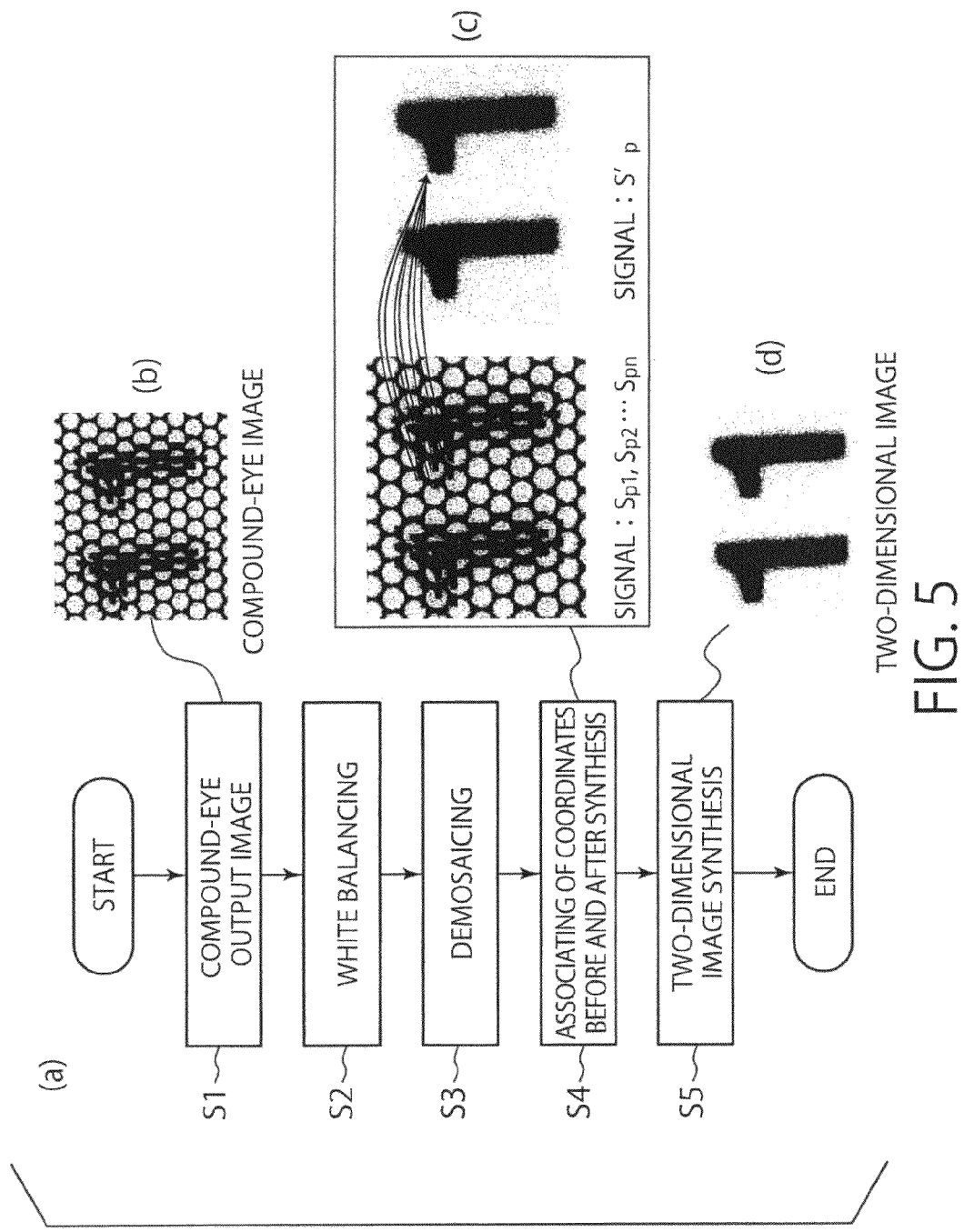
FIGS. 5(a) through 5(d) are diagrams for explaining a two-dimensional image synthesis method.

Referring now to FIGS. 5(a) through 5(d), an image synthesis method for reconstructing a two-dimensional image is described. FIG. 5(a) shows the procedures for synthesizing an image. First, in step S1, a compound-eye RAW image is extracted from the imaging element 16. The compound-eye RAW image is an image that is output from the imaging element 16, and an example of the compound-eye RAW image is shown in FIG. 5(b). White balancing for adjusting the signal balance among the B, G, and R pixels is performed on the compound-eye RAW image by using a known technique (step S2). Since there is no G and B signal information at the locations of R pixels, for example, demosaicing is performed to estimate and generate G and B signals by referring to the pixels located around the R pixels (step S3). Here, the mean values may be simply calculated from the surrounding pixels. However, various other methods may be used, such as widening the pixel range to be referred to, where necessary. The demosaicing is also performed for the G pixels and the B pixels.

Figure 3:
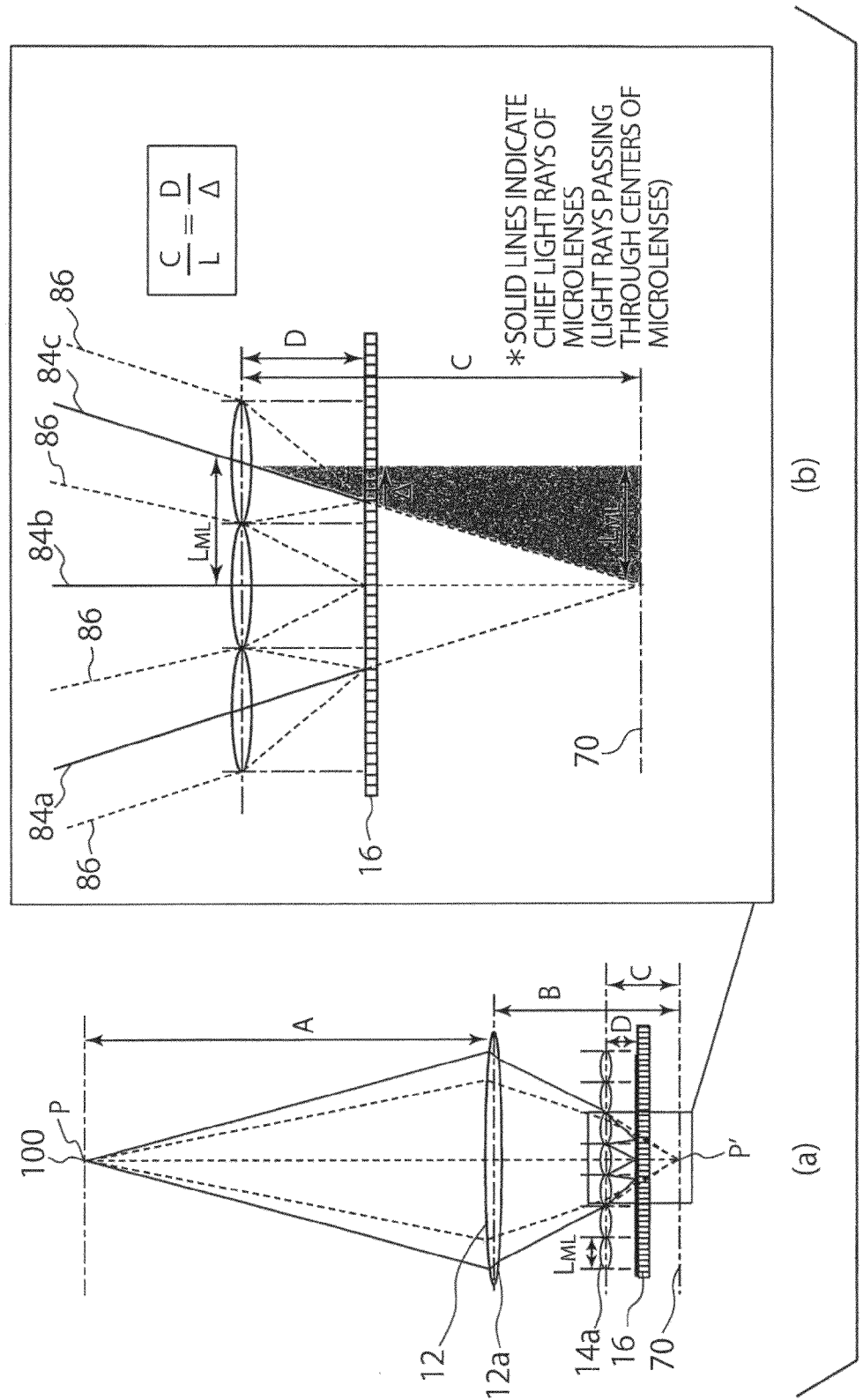
FIGS. 3(a) and 3(b) are diagrams showing the geometric optics relationship between microlenses in the vicinity of the optical axis of the imaging lens in the solid-state imaging device of the first embodiment.

Pixel signal values $S_{p1}, S_{p2}, \ldots$, and $S_{pn}$ obtained by the imaging element 16 recording the image points p1, p2, ..., and pn corresponding to the single object point P as shown in FIG. 3 are associated with a synthesized signal $S'_p$ in n-to-1 correspondence (see step S4 and FIG. 5(c)). The associating is performed by detecting the relationship in the shift length $\Delta$ among the image points and the relationship among the visual field overlaps, as described above. In step S5, an image is synthesized by a two-dimensional image synthesizing method, to obtain a two-dimensional image. The operation then comes to an end. An example of the two-dimensional image obtained in this manner is shown in FIG. 5(d).

The two-dimensional image synthesizing method is now described. The pixel signal values of n pixels are represented by $S_{p1}, S_{p2}, \ldots$, and $S_{pn}$, and the noise values of those pixels are represented by $N_{p1}, N_{p2}, \ldots$, and $N_{pn}$. First, a luminance correcting operation is performed on each of the pixel signal values and the noise values. The luminance correcting operation will be described later in detail, and the pixel signal values $S_{p1}, S_{p2}, \ldots$, and $S_{pn}$ are multiplied by luminance correction factors $a_1, a_2, \ldots$, and $a_n$, which are determined by the technique described later. The values $a_i S_{pi}$ (i=1, ..., n) obtained through the multiplications are averaged by using the equation (10), and the value obtained through the averaging is set as the signal value $S'_p$ obtained through the synthesis. Also, the noise value $N'_p$ contained in the synthesized signal value $S'_p$ is calculated by using the equation (11).

$$S'_p = \{a_1 S_{p1} + a_2 S_{p2} + \ldots + a_n S_{pn}\}/n \quad (10)$$

$$N'_p = \{(a_1 N_{p1})^2 + (a_2 N_{p2})^2 + \ldots + (a_n N_{pn})^2\}^{1/2}/n \quad (11)$$

The above described steps can be reversed in order, depending on the synthesis method. For example, the sequence of S1 through S5 can be shuffled where necessary, such as performing the demosaicing after the two-dimensional image formation.

(Decreases in Peripheral Light Amount)

Figure 6:
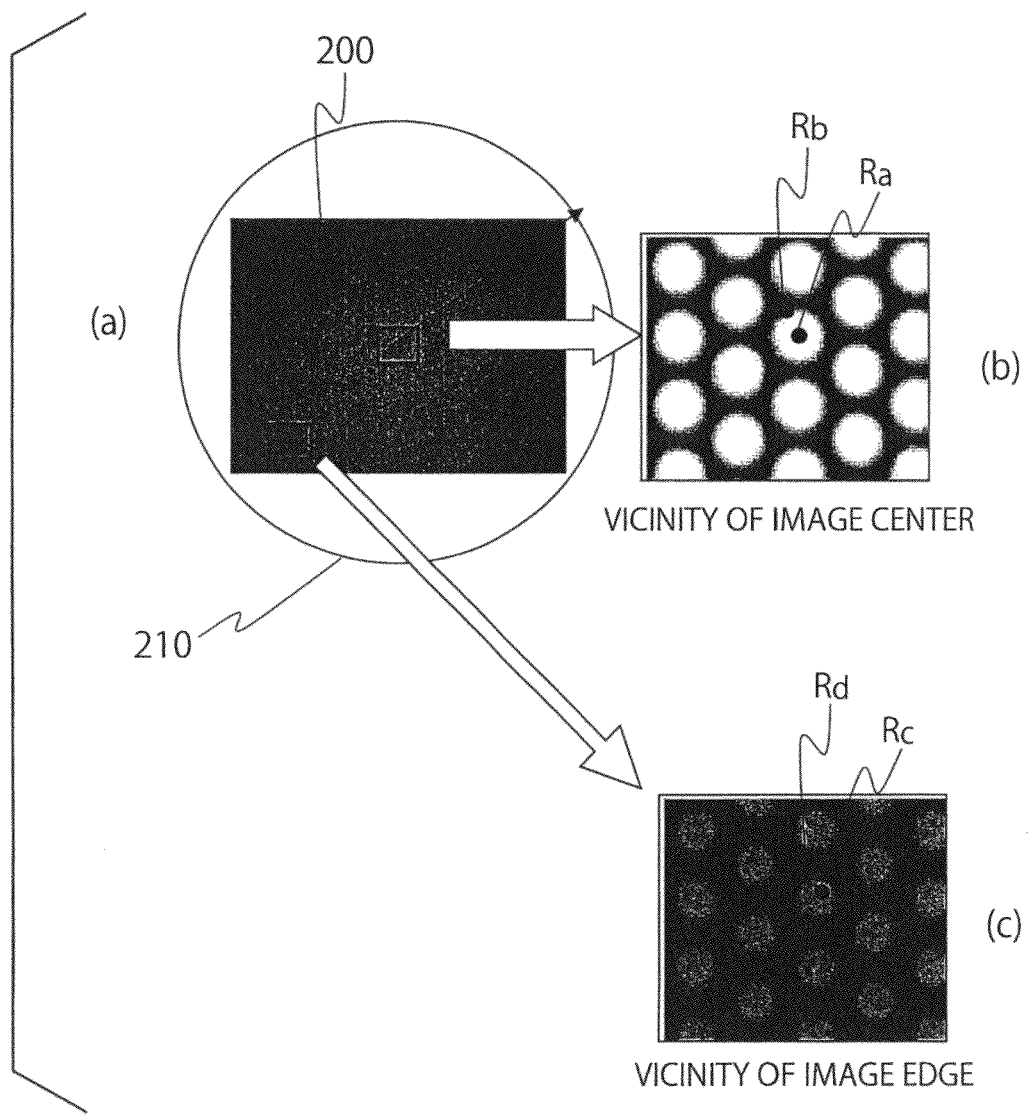
FIGS. 6(a) through 6(c) are diagrams for explaining the luminance distribution in a compound-eye image.

Referring now to FIGS. 6(a) through 6(c), decreases in peripheral light amount that occur at the imaging lens 12 and the microlens unit 14a are described. FIG. 6(a) shows an output image 200 in a case where an image having uniform luminance (a uniformly white image, for example) is captured by a compound-eye imaging system. The circle 210 shown in FIG. 6(a) is an image circle formed by the imaging lens 12. FIG. 6(b) is an enlarged view of an image near the center of the output image 200. FIG. 6(c) is an enlarged view of an image near an edge of the output image 200. In FIG. 6(b), Ra represents the center region of a microlens, and Rb represents the edge region of the microlens. In FIG. 6(c), Rc represents the center region of a microlens, and Rd represents the edge region of the microlens.

As shown in FIGS. 6(b) and 6(c), in the compound-eye image, the amount of incident light decreases toward the image edges or farther away from the optical axis of the imaging lens 12, and the amount of incident light also decreases toward the edge of each microlens image or farther away from the optical axis of each microlens. This is called the cosine fourth law, based on the fact that an off-axis object point image that is normally generated in an imaging lens system and enters the entrance pupil at an angle ω becomes darker in proportion to $\cos^4 \omega$. In an example case where the object is a perfectly diffusing plane surface having uniform luminance, the following three facts are the causes of the decreases, with P representing the object point on the optical axis, Q representing the off-axis object point.

1) The amount of light flux generated from the off-axis object point Q decreases in proportion to $\cos \omega$, compared with the amount of light flux from the object point P of the same area on the optical axis.

2) Since the off-axis object point Q is farther away from the pupil than the object point P on the optical axis, the solid angle with respect to the same pupil becomes smaller in proportion to $\cos^2 \omega$.

3) The orthogonal projection of the pupil seen from the off-axis object point Q becomes smaller in proportion to $\cos \omega$.

Accordingly, as the product of all the effects, the amount of incident light flux from the off-axis object point Q or the image surface illuminance is proportional to $\cos^4 \omega$ with respect to the center.

As the decreases in light amount occur in both the imaging lens and the microlenses, the decrease in the light amount becomes larger toward the image edges defined by the imaging region located in the image circle 210 (FIG. 6(a)) formed by the imaging lens 12, and the decrease in the light amount becomes larger toward the edge of each microlens image. A short focus lens with a wide field angle such as a portable camera module normally has a large decrease particularly in peripheral light amount.

(Luminance Correcting Operation)

Next, a method of determining the luminance correction factors $a_1, a_2, \ldots,$ and $a_n$ for correcting the decreases in peripheral light amount that occur both in the imaging element 12 and the microlens unit 14a is described. To correct the decreases in light amount, a luminance correcting operation is performed. The luminance correction factors $a_1, a_2, \ldots,$ and $a_n$ are calculated from a compound-eye image obtained by capturing an image having uniform luminance (a uniformly white image, for example) or a simulation image subject to a similar optical simulation. In a case where there are no decreases in light amount caused by the lens system, the luminance correction factors $a_1, a_2, \ldots,$ and $a_n$ are calculated for the respective pixel positions, so that the portion having the decreases in light amount in the entire image matches the pixel value having the highest luminance without a decrease in the light amount, to obtain an object image with uniform signal amounts.

(Pixel CF Arrays)

Figure 7:
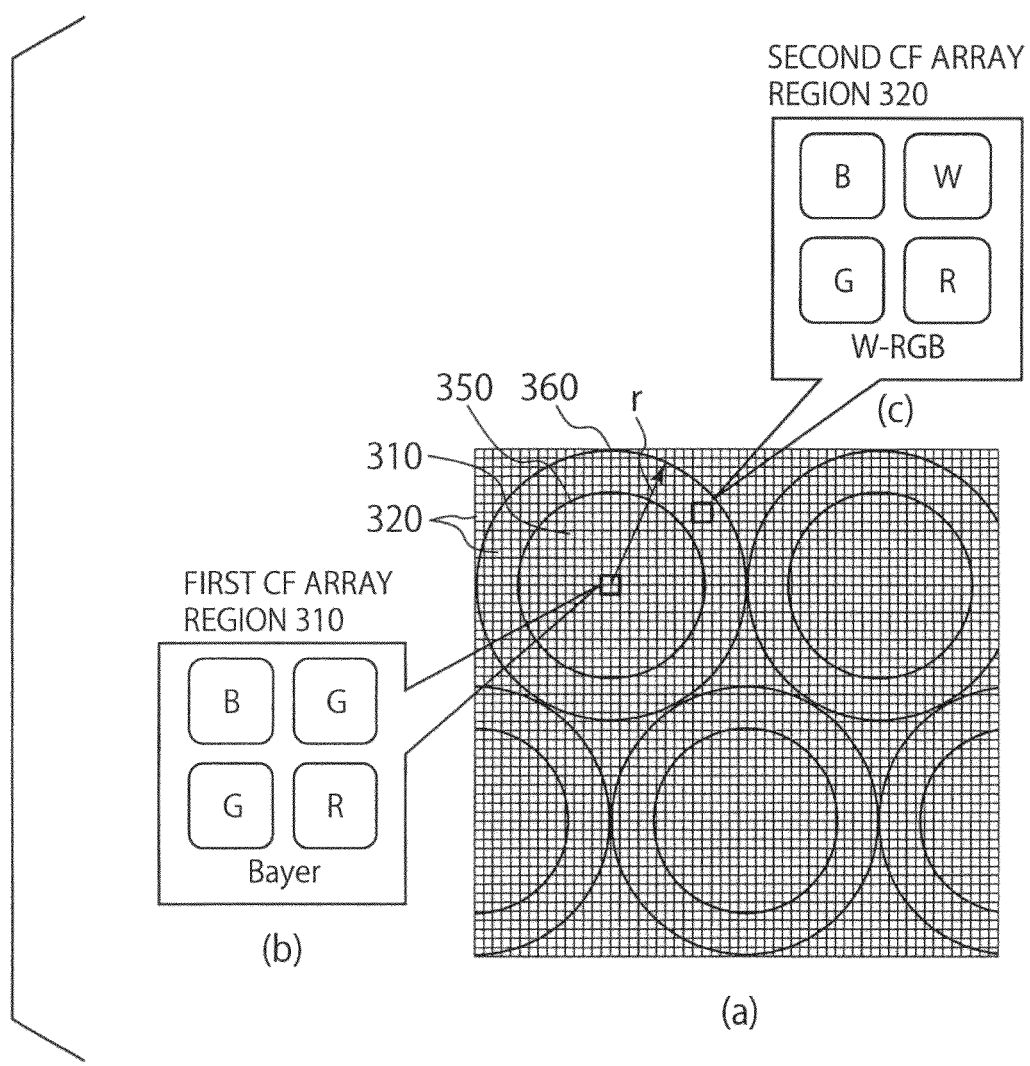
FIGS. 7(a) through 7(c) are diagrams for explaining an example of the pixel CF arrays in the first embodiment.
Figure 8:
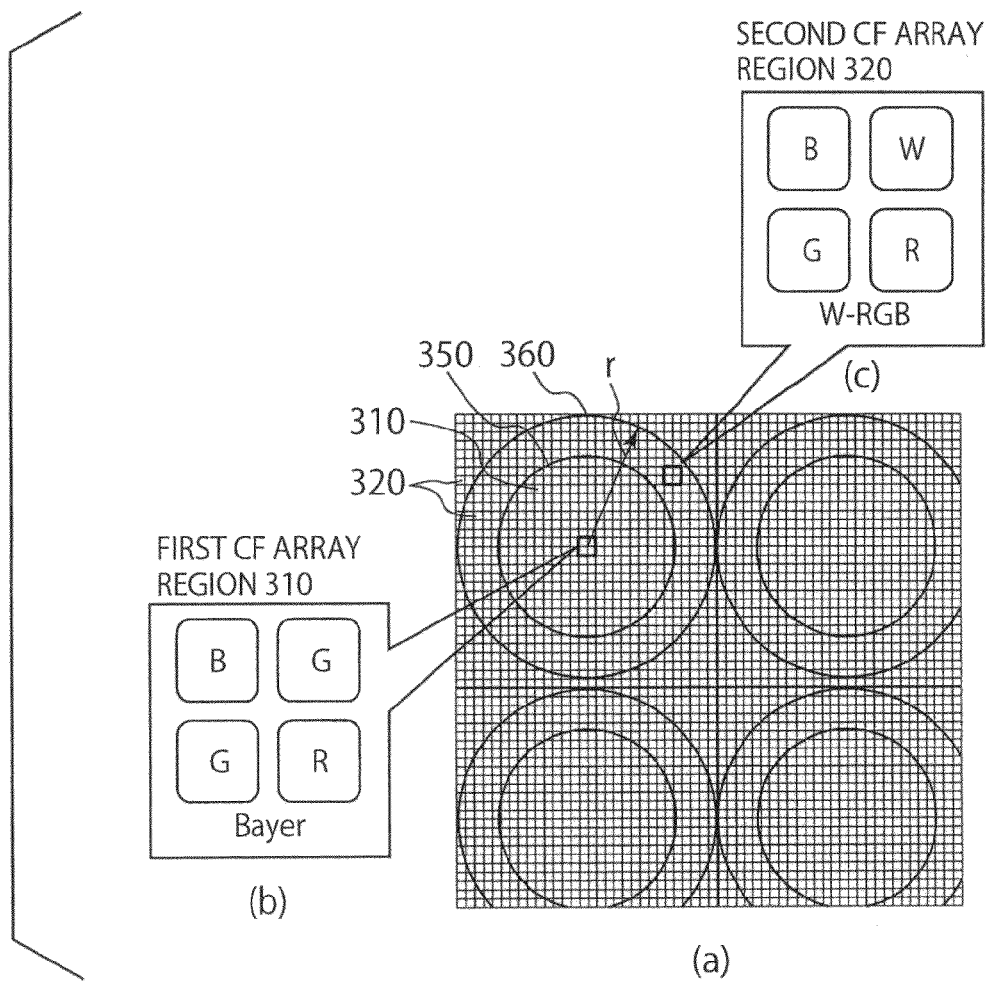
FIGS. 8(a) through 8(c) are diagrams for explaining another example of the pixel CF arrays in the first embodiment.

Referring now to FIGS. 7(a) through 8(c), the pixel color filter (CF) arrays in this embodiment is described. FIG. 7(a) illustrates a case where microlenses are in a hexagonal array, and FIG. 8(a) illustrates a case where microlenses are in a square array. Both cases share the same concept about the CF array in each microlens image. In FIGS. 7(a) and 8(a), "r" represents the radius of a microlens.

The region near each microlens image center having a small decrease in light amount is a first CF array region 310, and the first CF array region 310 has the Bayer array shown in FIG. 7(b) or 8(b). The Bayer array is often used in CMOS image sensors. In the Bayer array, a red (R) filter and a blue (B) filter are diagonally arranged in each 2×2 pixel subblock, and green (G) filters are diagonally arranged in each 2×2 pixel subblock. That is, each pixel block is formed with pixel subblocks. All the regions other than the first CF array region 310, including the region near the microlens image edge 360 having a large decrease in light amount, are in a second CF array region 320. The second CF array region 320 has the W-RGB array shown in FIG. 7(c) or 8(c). In the W-RGB array, one of the G filters in the Bayer array is replaced with a W filter (which passes all the R, G, and B wavelength regions). In FIGS. 7(a) and 8(a), reference numeral 350 denotes the boundary between the CF arrays.

In a case where $P_{pix}$ is a pixel parameter, and an image of an object having uniform luminance is captured, the position having a light amount that is $1/P_{pix}$ of the light amount in the pixel position having the largest light amount in the microlens image is the switching region (boundary) 350 between the first and second CF arrays. The position having the largest light amount is normally the center of a microlens image on the imaging lens optical axis, and shifts from the center of a microlens image depending on the principal ray of light passing through the imaging lens in a imaging element region that is farther away from the imaging lens optical axis. As a result, an asymmetrical light amount distribution is formed. The position having the largest light amount can also be detected by performing an optical simulation on the assumption that an image of an object having uniform luminance is captured, or can be detected from an obtained image.

The pixel parameter $P_{pix}$ is a value that is set based on the relationship between the sensitivity ratio between the pixel (W pixel) located immediately below a W filter and the pixel (G pixel) located immediately below a G (or B or R) filter, and the signal saturation amounts of the W pixel and the G pixel. For example, the exposure amounts with which the saturation levels of the W pixel and the G pixel are reached are represented by Imax(W) and Imax(G), respectively. Here, the pixel parameter $P_{pix}$ is expressed as $P_{pix} = \mathrm{Imax}(G)/\mathrm{Imax}(W)$.

(Relationship between the Sensitivity Ratio between W Pixels and G Pixels, and the Signal Saturation Amounts)

Figure 9:
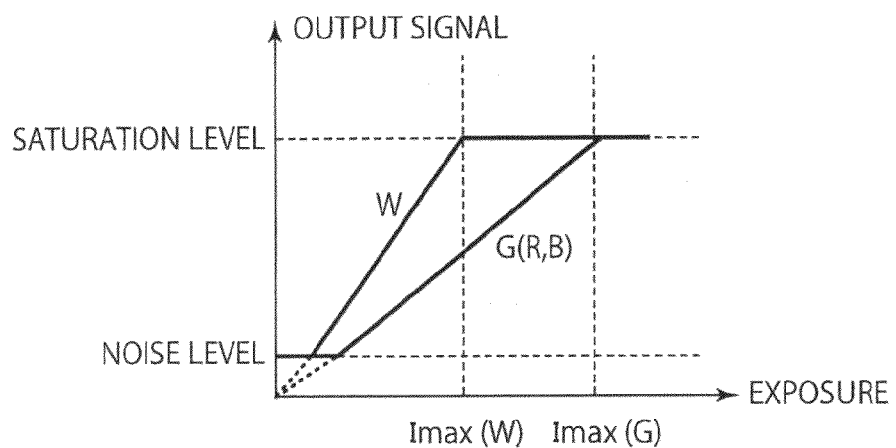
FIG. 9 is a graph for explaining the relationship between the sensitivities and the saturations of W pixels, R pixels, G pixels, and B pixels.

Referring now to FIG. 9, the relationship between the sensitivities and saturations of W pixels and G (or B or R) pixels is described. FIG. 9 shows the exposure amount (illuminance×exposure time) on the abscissa axis, and output signals of the W pixels and the G pixels on the ordinate axis. All the photodiodes formed in the imaging region are normally considered to have the same signal saturation amount and the same noise amount. Here, the W filters pass light of all the wavelength regions, and cause the photodiodes to convert the light into signals. Accordingly, the number of photons that enters the pixels is larger than that entering the G pixels that selectively pass the light of the G wavelength region from the W pixels. Accordingly, even when a photoelectric conversion is performed with a small amount of exposure light (low illuminance), a high output signal can be obtained. Therefore, where a comparison is made in the same exposure time, the S/N ratio (output signal/noise) obtained with lower illuminance is higher. However, as the exposure amount increases, the output signal easily reaches the saturation level above the upper limit value, and where a comparison is made in the same exposure time, the output signal is easily saturated when the illuminance is high. As signals are saturated, accurate exposure amounts cannot be detected. As for the G pixel, where a comparison is made in the same exposure time, the S/N ratio obtained with low illuminance is poor, but saturation does not easily occur when the exposure amount increases. A larger amount of light passes through the center of each microlens, and a smaller amount of light passes through the outer peripheral portion of each microlens. Therefore, the proportion of W pixels is made higher from the center toward the outer peripheral portion of each pixel block.

For example, the exposure amounts with which the saturation levels of the W pixels and the G pixels are reached are represented by Imax(W) and Imax(G), for example. At this point, the pixel parameter $P_{pix}$ is expressed as $P_{pix} = \mathrm{Imax}(G)/\mathrm{Imax}(W)$, and a larger number of W pixels are placed in the second CF array region 320 of each pixel block having a light amount decrease to $1/P_{pix}$ or less in the direction from the radius r of each microlens toward the outer periphery. In this manner, signal saturation is prevented in the second CF array region 320, and the low-illuminance S/N ratio can be improved, as long as signal saturation does not occur in the first CF array region 310.

In a first example case where Imax(G) is 200 and Imax(W) is 100, $P_{pix}$ is 2. Therefore, the position where the light amount decreases by ½ is set as the boundary, and the pixel blocks on the outer peripheral side of the boundary are set as the CF array containing W pixels.

In a second example case where Imax(G) is 300 and Imax(W) is 100, $P_{pix}$ is 3. Therefore, the position where the light amount decreases by ⅓ is set as the boundary, and the pixel blocks on the outer peripheral side of the boundary are set as the CF array containing W pixels.

Next, two methods A) and B) for calculating the color components R, G, and B in the W pixel positions are described.

A) A first method is a method for calculating the pixel values of R, G, and B from peripheral pixels in the demosaicing process in the flowchart shown in FIG. 5(a). In the demosaicing process, an interpolating operation is performed on color information that is not contained in a target pixel and is to be generated, based on the pixel values that are located nearby and have the target color. In this manner, pixel values are set. By another method, a color interpolating operation can be performed on the pixel value of a pixel not having a filter of a target color with respect to the target color, by using the pixel values of the pixels located in the vicinity of the target pixel and using the correlations with the other color signals, regardless of colors. By the method using the color interpolating operation, the information about the positions of pixels that do not exist is interpolated by using the correlations between the same color and the other colors in the vicinities of the pixel positions. Other than that, the interpolating operation can be performed in various manners.

Figure 10:
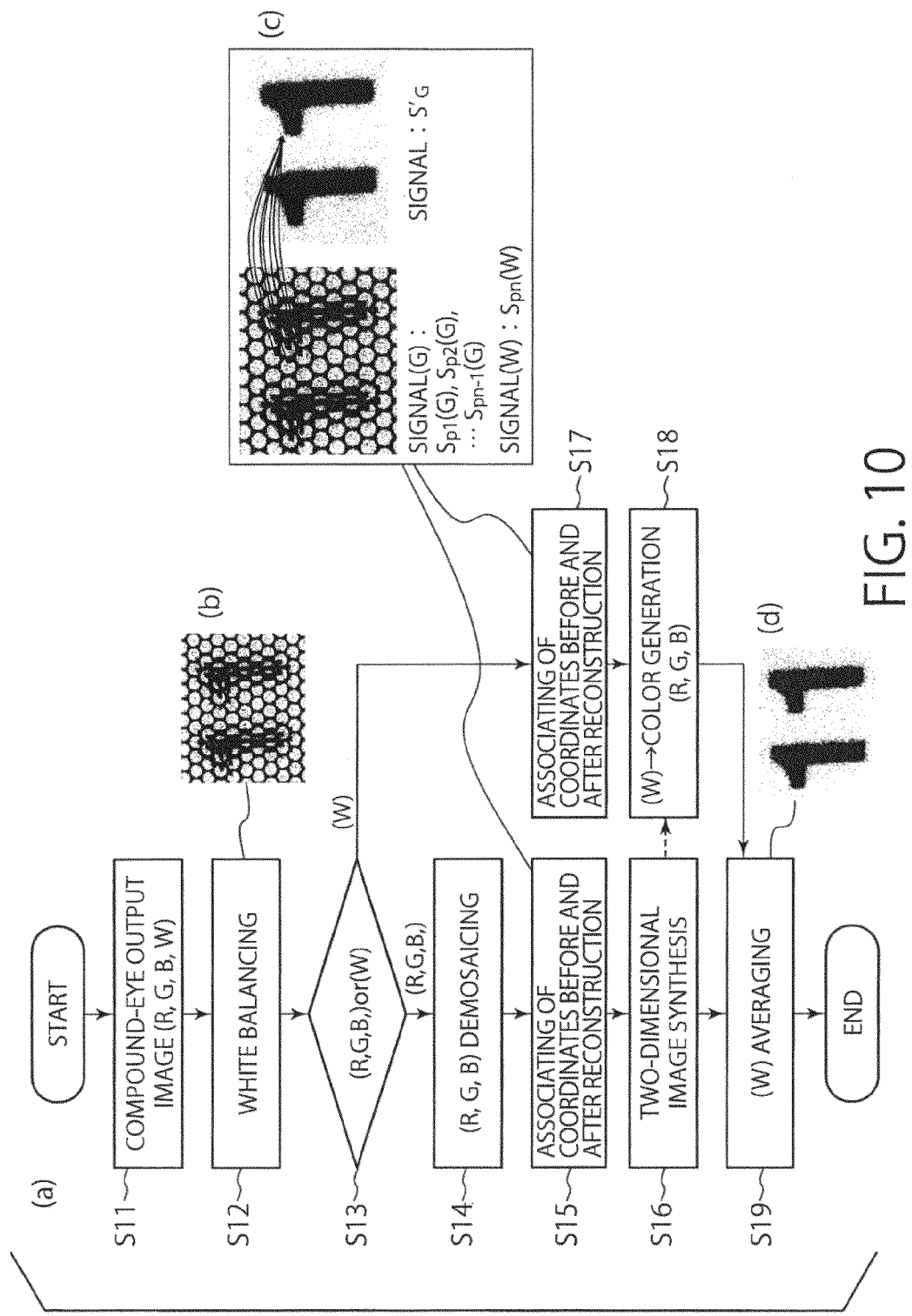
FIGS. 10(a) through 10(d) are diagrams for explaining a method of reconstructing a two-dimensional image when the compound-eye image contains W pixels.

B) Referring now to FIGS. 10(a) through 10(d), a second method is described. First, in step S11, a compound-eye RAW image is extracted from the imaging element 16. White balancing for adjusting the signal balance among the B, G, and R pixels is performed on the compound-eye RAW image output from the imaging element 16 by using a known technique (step S12). An example of the image subjected to the white balancing is shown in FIG. 10(b). A check is made to determine whether each of the pixels in the output image is a R pixel, a G pixel, a B pixel, or a W pixel (step S13). If each pixel is a R pixel, a G pixel, or a B pixel, demosaicing is performed in the same manner as described with reference to FIG. 5(a) (step S14). The coordinates before and after synthesis are associated with each other, and a two-dimensional image synthesizing operation is performed in the same manner as in steps S4 and S5 shown in FIG. 5(a) (steps S15 and S16).

If a pixel is a W pixel in step S13, the coordinates before and after the synthesis are associated with each other in step S17. An example of the image obtained after the associating of the coordinates before and after the synthesis is shown in FIG. 10(c). Based on the result of the two-dimensional image synthesizing operation performed in step S16 and the result of the associating of the coordinates before and after the synthesis in step S17, a color is generated from the W pixel (step S18).

An example case is now described. In this example case, only one image point among the pixel signal values in the imaging element 16 recording n image points p1, p2, ..., and pn corresponding to the single object point P shown in FIG. 3 is captured with a W pixel, and the remaining (n−1) image points are captured with R, G, or B pixels. Here, the pixel signal values $S_{p1}$, $S_{p2}$, ..., and $S_{pn}$ obtained by recording the n image points p1, p2, and pn are associated with a signal value $S'_p$ after the synthesis in n-to-1 correspondence.

Among the (n−1) pixel values captured with the R, G, and B pixels, the G pixels have $S_{p1(G)}$, $S_{p2(G)}$, ..., and $S_{pn-1(G)}$ components after the demosaicing, and likewise, the R pixels and the B pixels have $S_{p1(R)}$, ..., $S_{pn-1(R)}$, $S_{p1(B)}$, ..., and $S_{pn-1(B)}$ components after the demosaicing. Those signal values are associated with a signal $S''_{p(G)}$ after the first-stage synthesis in the same manner as described above, and a two-dimensional image synthesizing operation is performed. That is, an averaging operation according to the equation (12) is performed. An example of the G components is expressed by the equation (12):

$$S''_{p(G)} = \{a_1 S_{p1(G)} + a_2 S_{p2(G)} + \ldots + a_{n-1} S_{pn-1(G)}\}/(n-1) \quad (12)$$

The noise value N" contained in the signal value after the synthesis is calculated according to the equation (13):

$$N''_{p(G)} = \{(a_1 N_{p1(G)})^2 + (a_2 N_{p2(G)})^2 + \ldots + (a_{n-1} N_{pn-1(G)})^2\}^{1/2}/(n-1) \quad (13)$$

As for R and B, the same averaging operation is performed. The signals $S''_{p(R)}$, $S''_{p(G)}$, and $S''_{p(B)}$ are obtained as the results of the syntheses of the respective three colors.

As for the remaining W pixel value $S_{pn(w)}$ associated with a signal $S'_{p(G)}$ after the last synthesis with the W pixel being taken into account, $S_{pn(R')}$, $S_{pn(G')}$, and $S_{p(B')}$ are calculated from the color ratios among $S''_{p(R)}$, $S''_{p(G)}$, and $S''_{p(B)}$. Here, R', G', and B' represent color components generated from W. In the case of G', for example, $S_{pn(G')}$ is calculated according to the equation (14):

$$S_{pn(G')} = S_{pn(W)} \times S''_{p(G)}/\{S''_{p(R)} + S''_{p(G)} + S''_{p(B)}\} \quad (14)$$

A color generating operation is performed for R and B as well (step S18). After that, a second-stage synthesizing operation is performed, with W being included in the averaging (step S19). The synthesis is expressed by the equation (15):

$$S'_{p(G)} = S''_{p(G)} + a_n S_{pn(G')}/2 \quad (15)$$

The same operation is performed for the R and B pixels, and signals $S'_{p(R)}$, $S'_{p(G)}$, and $S'_{p(B)}$ are obtained after the last-stage synthesis.

As described above, according to the first embodiment, high-sensitivity W pixels are placed in peripheral portions that have low illuminance due to decreases in peripheral light amount in the imaging lens and microlenses. Accordingly, the S/N ratios in the pixels located in the peripheral portions of microlens images, and the S/N ratio in a two-dimensional image resynthesized by using those pixels can be improved.

Second Embodiment

Figure 11:
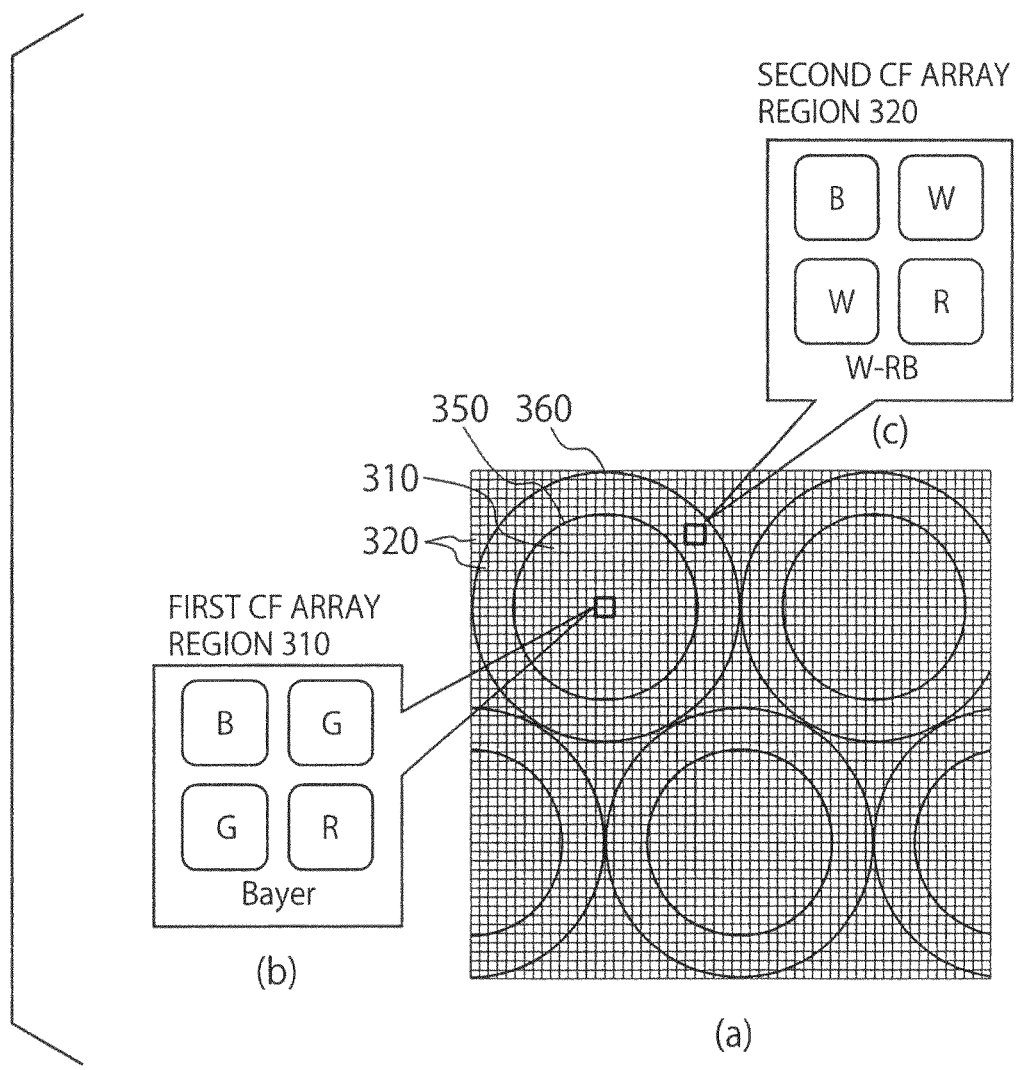
FIGS. 11(a) through 11(c) are diagrams for explaining the pixel CF arrays in a solid-state imaging device according to a second embodiment.

Referring now to FIGS. 11(a) through 11(c), a solid-state imaging device according to a second embodiment is described. The solid-state imaging device of the second embodiment differs from the solid-state imaging device of the first embodiment in the pixel CF arrays.

FIG. 11(a) shows pixel CF arrays in the solid-state imaging device of the second embodiment. Although FIG. 11(a) shows a case where microlenses are in a hexagonal array, those pixel CF arrays can also be used in a case where microlenses are in a square array as shown in FIG. 8(a).

In the second embodiment, the region near each microlens image center having a small decrease in light amount is a first CF array region 310, and the first CF array region 310 has the Bayer array shown in FIG. 11(b). The Bayer array is often used in CMOS image sensors.

All the region other than the first CF array region 310, including the region near the microlens image edge 360 having a large decrease in light amount, are in a second CF array region 320. The second CF array region 320 has the W-RB array shown in FIG. 11(c). In the W-RB array in the second CF array region 320, a red (R) pixel and a blue (B) pixel are diagonally arranged in each 2×2 pixel subblock, and two white (W) pixels are diagonally arranged in each 2×2 pixel subblock, as shown in FIG. 11(c).

The position having a light amount that is $1/P_{pix}$ of the light amount in the pixel position having the largest light amount in the microlens image is the switching region (boundary) 350 between the first and second CF arrays 310 and 320, as described in the first embodiment.

The pixel parameter $P_{pix}$ is a value that is determined based on the relationship between the sensitivity ratio between W and G (or B or R), and the signal saturation amounts, as described in the first embodiment.

To calculate the R, G, and B color components in W pixel positions, the two methods described in the first embodiment can also be used.

In the second embodiment, high-sensitivity W pixels are placed in peripheral portions that have low illuminance due to decreases in peripheral light amount in the imaging lens and microlenses, as in the first embodiment. Accordingly, the S/N ratios in the pixels located in the peripheral portions of microlens images, and the S/N ratio in a two-dimensional image resynthesized by using those pixels can be improved.

Third Embodiment

Figure 12:
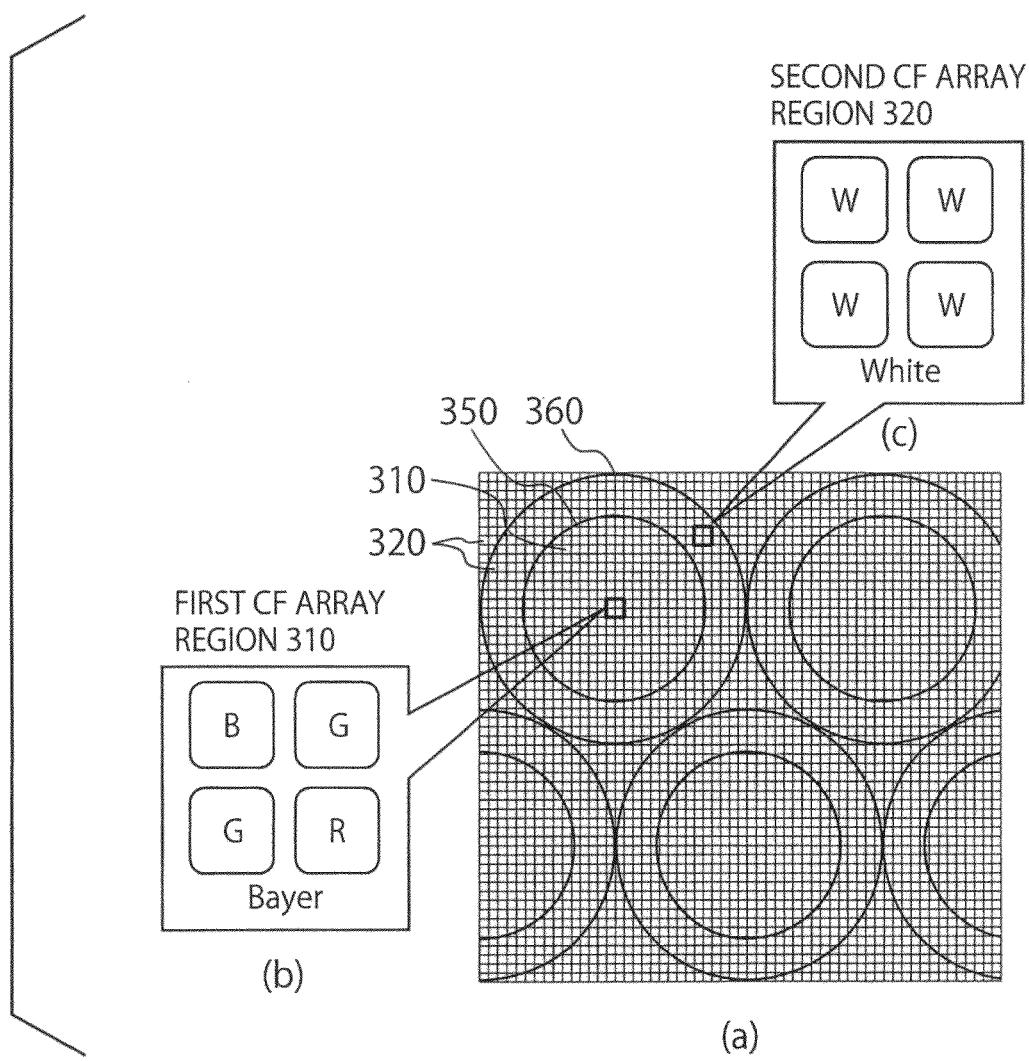
FIGS. 12(a) through 12(c) are diagrams for explaining the pixel CF arrays in a solid-state imaging device according to a third embodiment.

Referring now to FIGS. 12(a) through 12(c), a solid-state imaging device according to a third embodiment is described. The solid-state imaging device of the third embodiment differs from the solid-state imaging device of the first embodiment in the pixel CF arrays.

FIG. 12(a) shows pixel CF arrays in the solid-state imaging device of the third embodiment. Although FIG. 12(a) shows a case where microlenses are in a hexagonal array, those pixel CF arrays can also be used in a case where microlenses are in a square array as shown in FIG. 8(a).

In the third embodiment, the region near each microlens image center having a small decrease in light amount is a first CF array region 310, and the first CF array region 310 has the Bayer array shown in FIG. 12(b). All the regions other than the first CF array region 310, including the region near the microlens image edge 360 having a large decrease in light amount, are in a second CF array region 320. In the second CF array region 320, all the pixels are white (W) pixels, as shown in FIG. 12(c).

The position having a light amount of $1/P_{pix}$ in the pixel position having the largest light amount in the microlens image is the switching region (boundary) 350 between the first and second CF array regions 310 and 320, as described in the first embodiment.

The pixel parameter $P_{pix}$ is a value that is determined based on the relationship between the sensitivity ratio between W and G (or B or R), and the signal saturation amounts, as described in the first embodiment.

To calculate the R, G, and B pixel color components in W pixel positions, the two methods described in the first embodiment can also be used. In this embodiment, however, the use of the second method described in the first embodiment is preferable, since there is a high probability that the pixels adjacent to a W pixel are W pixels in the second CF array region 320.

In the third embodiment, high-sensitivity W pixels are placed in peripheral portions that have low illuminance due to decreases in peripheral light amount in the imaging lens and microlenses, as in the first embodiment. Accordingly, the S/N ratios in the pixels located in the peripheral portions of microlens images, and the S/N ratio in a two-dimensional image resynthesized by using those pixels can be improved.

Fourth Embodiment

Referring now to FIGS. 13(a) through 13(d), a solid-state imaging device according to a fourth embodiment is described. The solid-state imaging device of the fourth embodiment differs from the solid-state imaging device of the first embodiment in the pixel CF arrays.

Figure 13:
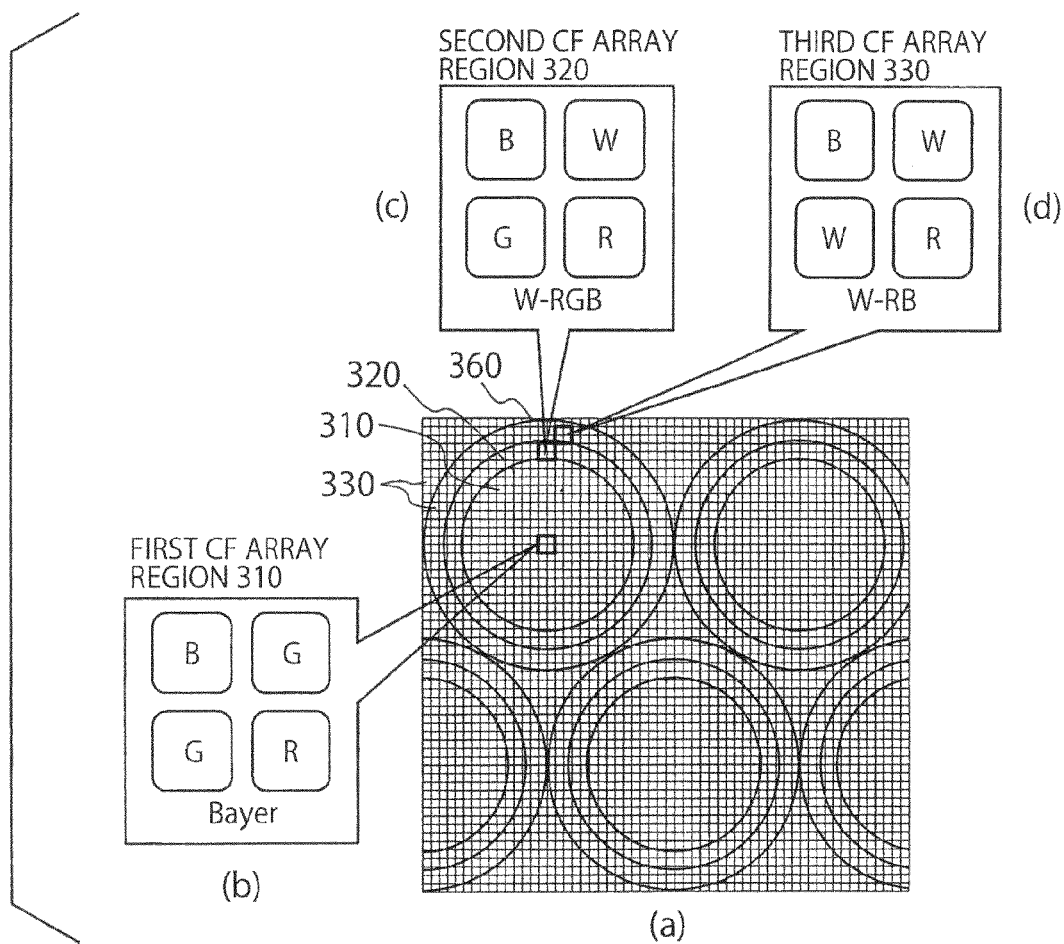
FIGS. 13(a) through 13(d) are diagrams for explaining the pixel CF arrays in a solid-state imaging device according to a fourth embodiment.

FIG. 13(a) shows pixel CF arrays in the solid-state imaging device of the fourth embodiment. Although FIG. 13(a) shows a case where microlenses are in a hexagonal array, those pixel CF arrays can also be used in a case where microlenses are in a square array as shown in FIG. 8(a).

In the fourth embodiment, the region near each microlens image center having a small decrease in light amount is a first CF array region 310, and the first CF array region 310 has the Bayer array shown in FIG. 13(b). Meanwhile, second and third CF array regions 320 and 330 are located in a radial direction of the microlens toward the region near the microlens image edge 360 having a large decrease in light amount. The second and third array regions 320 and 330 have two appropriate arrays selected from the W-RGB array shown in FIG. 13(c), the W-RB array shown in FIG. 13(d), and the all W-pixel array shown in FIG. 12(c). In any case, it is preferable to select a combination so that the proportion of W pixels becomes higher toward the outer periphery of the microlens.

The position having a light amount of $1/P_{pix}$ in the pixel position having the largest light amount in the microlens image is the switching region (boundary) 350 between the first and second CF array regions 310 and 320, as described in the first embodiment.

The pixel parameter $P_{pix}$ is a value that is determined based on the relationship between the sensitivity ratio between W and G (or B or R), and the signal saturation amounts, as described in the first embodiment.

The position having a light amount that is $1/Q_{pix}$ is the switching region between the second and third CF arrays 320 and 330, and the value of $Q_{pix}$ is greater than the value of $P_{pix}$. The third CF array region 330 contains all the regions other than the first and second CF array regions 320 and 310.

To calculate the R, G, and B pixel color components in W pixel positions, the two methods described in the first embodiment can also be used.

In the fourth embodiment, high-sensitivity W pixels are placed in peripheral portions that have low illuminance due to decreases in peripheral light amount in the imaging lens and microlenses, as in the first embodiment. Accordingly, the S/N ratios in the pixels located in the peripheral portions of microlens images, and the S/N ratio in a two-dimensional image reconstructed by using those pixels can be improved.

Figure 14:
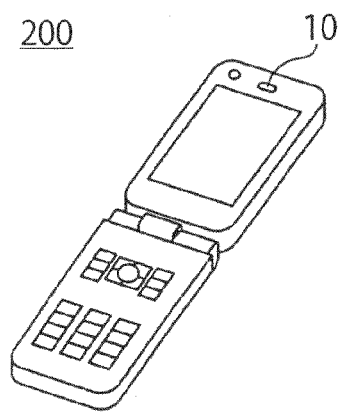
FIG. 14 is a diagram showing an example of a portable information terminal using the solid-state imaging device according to one of the first through fourth embodiments.

The solid-state imaging devices of the first through fourth embodiments can be applied not only to still cameras but also to the portable information terminal shown in FIG. 14. The portable information terminal shown in FIG. 14 is an example, and reference numeral 10 denotes the imaging module of the solid-state imaging device of any of the first through fourth embodiments.

As described so far, each of the embodiments can provide a solid-state imaging device and a portable information terminal that can improve the S/N ratios in the pixels in low-illuminance regions having decreases in light amount.

Not only in the above embodiments but also in other cases, pixel blocks located farther away from the center can improve the S/N ratios should they include a larger number of P pixels. Although each pixel subblock is formed with pixels arranged in two rows and two columns in the above described embodiments, the number of rows and columns are not limited to them. For example, each pixel subblock in the vicinity of the center of a pixel block may include two or more of R pixels, G pixels, and B pixels, or two or more of those R, G, and B pixels and W pixels. In that case, the outer peripheral portion of the pixel block includes more W pixels than those in the center portion.

While certain embodiments have been described, these embodiments have been presented by way of example only, and are not intended to limit the scope of the inventions. Indeed, the novel methods and systems described herein can be embodied in a variety of other forms; furthermore, various omissions, substitutions and changes in the form of the methods and systems described herein can be made without departing from the spirit of the inventions. The accompanying claims and their equivalents are intended to cover such forms or modifications as would fall within the scope and spirit of the inventions.

What is claimed is:

1. A solid-state imaging device comprising:
   an imaging element including a semiconductor substrate and a plurality of pixel blocks, each of the pixel blocks including at least two of each of R pixels, G pixels, B pixels, and W pixels;
   a first optical system configured to form an image of an object on an imaging plane; and
   a second optical system including a microlens array having a plurality of microlenses provided for the respective pixels blocks, the second optical system being located between the imaging element and the first optical system, the second optical system being configured to reduce and re-image the image formed on the imaging plane onto each of the pixel blocks,
   wherein a proportion of the W pixels to be provided increases in a direction from a center of pixel blocks toward an outer periphery thereof.

2. The device according to claim 1, wherein
   a first region including the center of one of the pixel blocks has first pixel subblocks arranged therein, each of the first pixel subblocks being formed with two rows and two columns of the R pixels, the G pixels, and the B pixels, and
   a second region other than the first region in the pixel block has second pixel subblocks arranged therein, the second pixel subblocks including the W pixels.

3. The device according to claim 2, wherein
   each of the first pixel subblocks is a Bayer array, and
   each of the second pixel subblocks is one of
   a pixel subblock formed with one of the W pixels, one of the R pixels, one of the G pixels, and one of the B pixels,
   a pixel subblock formed with two of the W pixels, one of the R pixels, and one of the B pixels, and
   a pixel subblock formed with four of the W pixels.

4. The device according to claim 1, wherein
   a first region including the center of one of the pixel blocks has first pixel subblocks arranged therein, each of the first pixel subblocks being formed with two rows and two columns of the R pixels, the G pixels, and the B pixels,
   a second region surrounding the first region in the pixel block has second pixel subblocks arranged therein, the second pixel subblocks including the W pixels, and
   a third region surrounding the second region in the pixel block has third pixel subblocks each including two of the W pixels.

5. The device according to claim 2, wherein a boundary between the first region and the second region is determined by a sensitivity ratio between the W pixels and the R pixels, the G pixels, or the B pixels.

6. The device according to claim 1, further comprising
   a signal processing unit comprising:
   a first processing unit configured to perform white balancing on a compound-eye image captured by the imaging element;
   a second processing unit configured to perform demosaicing on R pixels, G pixels, and B pixels in the compound-eye image subjected to the white balancing, and not to perform demosaicing on W pixels in the compound-eye image;
   a third processing unit configured to associate coordinates obtained prior to a two-dimensional image synthesizing operation with coordinates obtained after the two-dimensional image synthesizing operation, the coordinates being of the R pixels, the G pixels, and the B pixels in the compound-eye image subjected to the demosaicing, and of the W pixels in the compound-eye image;
   a fourth processing unit configured to synthesize a two-dimensional image by using the R pixels, the G pixels, and the B pixels in the compound-eye image subjected to the coordinates associating;
   a fifth processing unit configured to determine R, G, and B color components in the W pixels in the two-dimensional image synthesized by the fourth processing unit, by using the results of the associating of the coordinates of the W pixels in the compound-eye image prior to and after the two-dimensional image synthesizing operation; and
   a sixth processing unit configured to add the R, G, and B color components in the W pixels determined by the fifth processing unit, to the two-dimensional image synthesized by the fourth processing unit.

7. A portable information terminal, comprising the solid-state imaging device according to claim 1.

8. The terminal according to claim 7, wherein
   a first region including the center of one of the pixel blocks has first pixel subblocks arranged therein, each of the first pixel subblocks being formed with two rows and two columns of the R pixels, the G pixels, and the B pixels, and
   a second region other than the first region in the pixel block has second pixel subblocks arranged therein, the second pixel subblocks including the W pixels.

9. The terminal according to claim 8, wherein
   each of the first pixel subblocks is a Bayer array, and
   each of the second pixel subblocks is one of
   a pixel subblock formed with one of the W pixels, one of the R pixels, one of the G pixels, and one of the B pixels,
   a pixel subblock formed with two of the W pixels, one of the R pixels, and one of the B pixels, and
   a pixel subblock formed with four of the W pixels.

10. The terminal according to claim 7, wherein
    a first region including the center of one of the pixel blocks has first pixel subblocks arranged therein, each of the first pixel subblocks being formed with two rows and two columns of the R pixels, the G pixels, and the B pixels,
    a second region surrounding the first region in the pixel block has second pixel subblocks arranged therein, the second pixel subblocks including the W pixels, and
    a third region surrounding the second region in the pixel block has third pixel subblocks each including two of the W pixels.

11. The terminal according to claim 8, wherein a boundary between the first region and the second region is determined by a sensitivity ratio between the W pixels and the R pixels, the G pixels, or the B pixels.

12. The terminal according to claim 7, further comprising
    a signal processing unit comprising:
    a first processing unit configured to perform white balancing on a compound-eye image captured by the imaging element;

a second processing unit configured to perform demosaicing on R pixels, G pixels, and B pixels in the compound-eye image subjected to the white balancing, and not to perform demosaicing on W pixels in the compound-eye image;

a third processing unit configured to associate coordinates obtained prior to a two-dimensional image synthesizing operation with coordinates obtained after the two-dimensional image synthesizing operation, the coordinates being of the R pixels, the G pixels, and the B pixels in the compound-eye image subjected to the demosaicing, and of the W pixels in the compound-eye image;

a fourth processing unit configured to synthesize a two-dimensional image by using the R pixels, the G pixels, and the B pixels in the compound-eye image subjected to the coordinates associating;

a fifth processing unit configured to determine R, G, and B color components in the W pixels in the two-dimensional image synthesized by the fourth processing unit, by using the results of the associating of the coordinates of the W pixels in the compound-eye image prior to and after the two-dimensional image synthesizing operation; and a sixth processing unit configured to add the R, G, and B color components in the W pixels determined by the fifth processing unit, to the two-dimensional image synthesized by the fourth processing unit.

* * * * *